United States Patent
Azamfar et al.

(10) Patent No.: US 12,135,258 B2
(45) Date of Patent: Nov. 5, 2024

(54) TOOL CONDITION MONITORING SYSTEM

(71) Applicants: University Of Cincinnati, Cincinnati, OH (US); Mazak Corporation, Florence, KY (US)

(72) Inventors: Moslem Azamfar, Cincinnati, OH (US); Vibhor Pandhare, Cincinnati, OH (US); Marcella Miller, Cincinnati, OH (US); Fei Li, Cincinnati, OH (US); Pin Li, Cincinnati, OH (US); Jaskaran Singh, Cincinnati, OH (US); Hossein Davari, Cincinnati, OH (US); Jay Lee, Mason, OH (US); Joseph Frank Sanders, Jr., Erlanger, KY (US); Keita Yamaguchi, Aichi (JP)

(73) Assignees: University of Cincinnati, Cincinnati, OH (US); Mazak Corporation, Florence, KY (US)

( * ) Notice: Subject to any disclaimer, the term of this patent is extended or adjusted under 35 U.S.C. 154(b) by 0 days.

(21) Appl. No.: 17/551,652

(22) Filed: Dec. 15, 2021

(65) Prior Publication Data
US 2022/0187164 A1   Jun. 16, 2022

Related U.S. Application Data

(60) Provisional application No. 63/125,625, filed on Dec. 15, 2020.

(51) Int. Cl.
*G01M 13/00* (2019.01)
*B23Q 17/24* (2006.01)
*G06F 30/27* (2020.01)

(52) U.S. Cl.
CPC ......... *G01M 13/00* (2013.01); *B23Q 17/2457* (2013.01); *G06F 30/27* (2020.01)

(58) Field of Classification Search
CPC .................. G01S 11/04; G01P 15/00
See application file for complete search history.

(56) References Cited

U.S. PATENT DOCUMENTS 6,270,292 B1 *  8/2001  Satran .................. B23C 5/2204
                                                          407/42
8,997,610 B2 *  4/2015  Ishida ....................... B23C 5/06
                                                          407/113

(Continued)

FOREIGN PATENT DOCUMENTS

| JP | 5622441 B2 * | 11/2014 |
| JP | 2020518470 A * | 6/2020 |
| WO | 2020212665 A1 | 10/2020 |

OTHER PUBLICATIONS

Machine translation of JP5622441B2 (Year: 2015).*

(Continued)

*Primary Examiner* — Lee E Rodak
*Assistant Examiner* — Sangkyung Lee
(74) *Attorney, Agent, or Firm* — Wood Herron & Evans LLP

(57) ABSTRACT

Systems, methods, and computer program products for monitoring a health condition of a tool. Operational data is collected from a machine while the machine is operating in a predetermined manner with the tool in each of at least two known health conditions. A plurality of features is extracted from the operational data, a training dataset is generated from the extracted features, and an analytic model is trained using the training dataset. The analytic model can then be used to determine the health condition of the tool by providing features extracted from operational data received from one or more field machines to the analytic model. The analytic model may then determine a health condition of the (Continued)

tool in the field machine based on like features extracted from the operational data from the one or more field machines.

17 Claims, 10 Drawing Sheets

(56) References Cited

U.S. PATENT DOCUMENTS

| | | | |
|---|---|---|---|
| 11,106,190 B2 | 8/2021 | Huang et al. | |
| 2003/0167613 A1* | 9/2003 | Rydberg | B23B 29/24 409/102 |
| 2009/0245947 A1* | 10/2009 | Turcot | B23C 5/08 407/94 |
| 2013/0060524 A1 | 3/2013 | Liao | |
| 2013/0129431 A1* | 5/2013 | Filho | B23C 5/109 407/102 |
| 2018/0272491 A1 | 9/2018 | Yang et al. | |
| 2019/0033821 A1* | 1/2019 | Kamiya | G05B 19/404 |
| 2019/0179297 A1 | 6/2019 | Kuroda et al. | |
| 2019/0210176 A1 | 7/2019 | Yamamoto | |

OTHER PUBLICATIONS

Machine translation of JP2020518470A (Year: 2020).*
PCT Office, Search Report and Written Opinion issued in PCT/US2021/063518 dated Mar. 22, 2022.
PCT Office, Search Report and Written Opinion issued in PCT/US2021/063528 dated Mar. 25, 2022.
PCT Office, International Preliminary Report on Patentability issued in PCT/US2021/063518 dated Jun. 13, 2023.

* cited by examiner

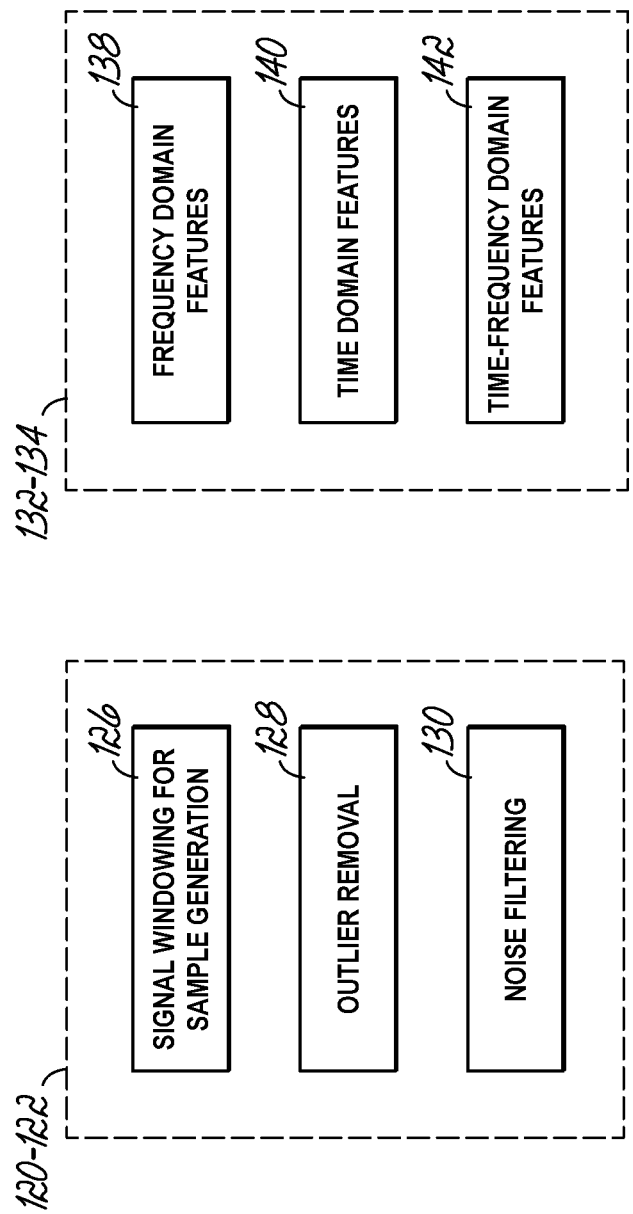

TOOL CONDITION MONITORING SYSTEM

CROSS-REFERENCE TO RELATED APPLICATIONS

The present application claims the filing benefit of U.S. Provisional Application Ser. No. 63/125,625, filed Dec. 15, 2020, the disclosure of which is incorporated by reference in its entirety.

FIELD OF THE INVENTION

The present invention relates generally to machine monitoring and, more particularly, to systems, methods, and computer program products for monitoring the condition of a tool in the machine.

BACKGROUND

A significant concern in the manufacturing industry maximizing productivity and quality in the manufacture of machined products. One of the factors that impacts productivity and quality of machined products is the condition of the tools used to machine workpieces into the machined products. By way of example, the condition of cutting tools, such as those used in milling machines, can have a significant effect on both the speed with which material can be removed from a workpiece and the quality of the finished product.

Conventional approaches to monitoring tool condition attempt to identify tool failures using frequency domain or time domain analysis of vibrations detected in the machine tool. However, known methods of for detecting tool condition have reliability issues. For example, they either produce an excessive number of false alarms (e.g., due to detection thresholds being set too low), or fail to detect a deteriorating tool condition before workpiece quality begins to suffer (e.g., due to detection thresholds being set too high).

Thus, there is a need for improved systems, methods, and computer program products that monitor the condition of tools during operation of a machine tool, and that provide users with information regarding the condition of the tool.

SUMMARY

The present invention overcomes the foregoing and other shortcomings and drawbacks of systems, methods, and computer program products heretofore known for use in monitoring the condition of tools in a machine tool. While the present invention will be discussed in connection with certain embodiments, it will be understood that the present invention is not limited to the specific embodiments described herein.

In an embodiment of the invention, a system for monitoring a health condition of a tool is provided. The system includes one or more processors, and a memory coupled to the one or more processors that includes program code. The program code is configured so that, when it is executed by the one or more processors, the program code causes the system to collect first operational data from a machine while the machine is operating in a predetermined manner with the tool in a first known health condition, collect second operational data from the machine while the machine is operating in the predetermined manner with the tool in a second known health condition, extract a first plurality of features from the first operational data, extract a second plurality of features from the second operational data, generate a training dataset from the first plurality of features and the second plurality of features, and train an analytic model to determine the health condition of the tool using the training dataset.

In an aspect of the invention, the program code may cause the system to generate the training dataset from the first plurality of features and the second plurality of features by comparing each feature of the first plurality of features to a like feature of the second plurality of features, and selecting a subset of features from each of the first plurality of features and the second plurality of features as the training dataset based on the comparisons.

In another aspect of the invention, the program code may cause the system to compare each feature of the first plurality of features to the like feature of the second plurality of features by determining a magnitude of a difference between the features being compared.

In another aspect of the invention, the program code may cause the system to select the subset of features from each of the first plurality of features and the second plurality of features as the training dataset based on the comparisons by selecting one or more features based on the magnitudes of the differences.

In another aspect of the invention, the tool may include a plurality of pockets, the first known health condition of the tool may be defined by operatively coupling inserts into each of a first number of the plurality of pockets, and the second known health condition of the tool may be defined by operatively coupling inserts into each of a second number of the plurality of pockets.

In another aspect of the invention, the first number may be equal to a total number of pockets in the tool, and the second number may be less than the first number.

In another aspect of the invention, the program code may cause the system to operate the machine in the predetermined manner by causing the machine to rotate the tool at a predetermined speed.

In another aspect of the invention, the machine may include a motor operatively coupled to a spindle, and each of the first operational data and the second operational data may include data indicative of one or more of a vibration, a power consumption of the motor, a speed of the motor, an amount of torque generated by the motor, a position of the spindle, a movement of the spindle, and a force applied to the spindle.

In another aspect of the invention, each plurality of features may include one or more of a frequency domain feature, a time domain feature, and a time-frequency domain feature.

In another embodiment of the invention, a method of monitoring the health condition of the tool is provided. The method includes collecting the first operational data from the machine while the machine is operating in the predetermined manner with the tool in the first known health condition, collecting the second operational data from the machine while the machine is operating in the predetermined manner with the tool in the second known health condition, extracting the first plurality of features from the first operational data, extracting the second plurality of features from the second operational data, generating the training dataset from the first plurality of features and the second plurality of features, and training the analytic model to determine the health condition of the tool using the training dataset.

In an aspect of the invention, generating the training dataset from the first plurality of features and the second plurality of features may include comparing each feature of the first plurality of features to the like feature of the second plurality of features, and selecting the subset of features from each of the first plurality of features and the second plurality of features as the training dataset based on the comparisons.

In another aspect of the invention, comparing each feature of the first plurality of features to the like feature of the second plurality of features may include determining the magnitude of the difference between the features being compared.

In another aspect of the invention, selecting the subset of features from each of the first plurality of features and the second plurality of features as the training dataset based on the comparisons may include selecting one or more features based on the magnitudes of the differences.

In another aspect of the invention, the first number may be equal to the total number of pockets in the tool, and the second number may be less than the first number.

In another embodiment of the invention, a computer program product for monitoring the health condition of the tool is provided. The computer program product includes a non-transitory computer-readable storage medium, and program code stored on the non-transitory computer-readable storage medium. The program code is configured so that, when executed by one or more processors, the program code causes the one or more processors to collect the first operational data from the machine while the machine is operating in the predetermined manner with the tool in the first known health condition, collect the second operational data from the machine while the machine is operating in the predetermined manner with the tool in the second known health condition, extract the first plurality of features from the first operational data, extract the second plurality of features from the second operational data, generate the training dataset from the first plurality of features and the second plurality of features, and train the analytic model to determine the health condition of the tool using the training dataset.

The above summary presents a simplified overview of some embodiments of the invention to provide a basic understanding of certain aspects of the invention discussed herein. The summary is not intended to provide an extensive overview of the invention, nor is it intended to identify any key or critical elements, or delineate the scope of the invention. The sole purpose of the summary is merely to present some concepts in a simplified form as an introduction to the detailed description presented below.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

FIG. 5 is a diagrammatic view of a sub-process for pre-processing signals for the process of FIG. 4.

FIG. 6 is a diagrammatic view of a process for extracting features from the preprocessed signals of FIG. 5.

Figure 1:
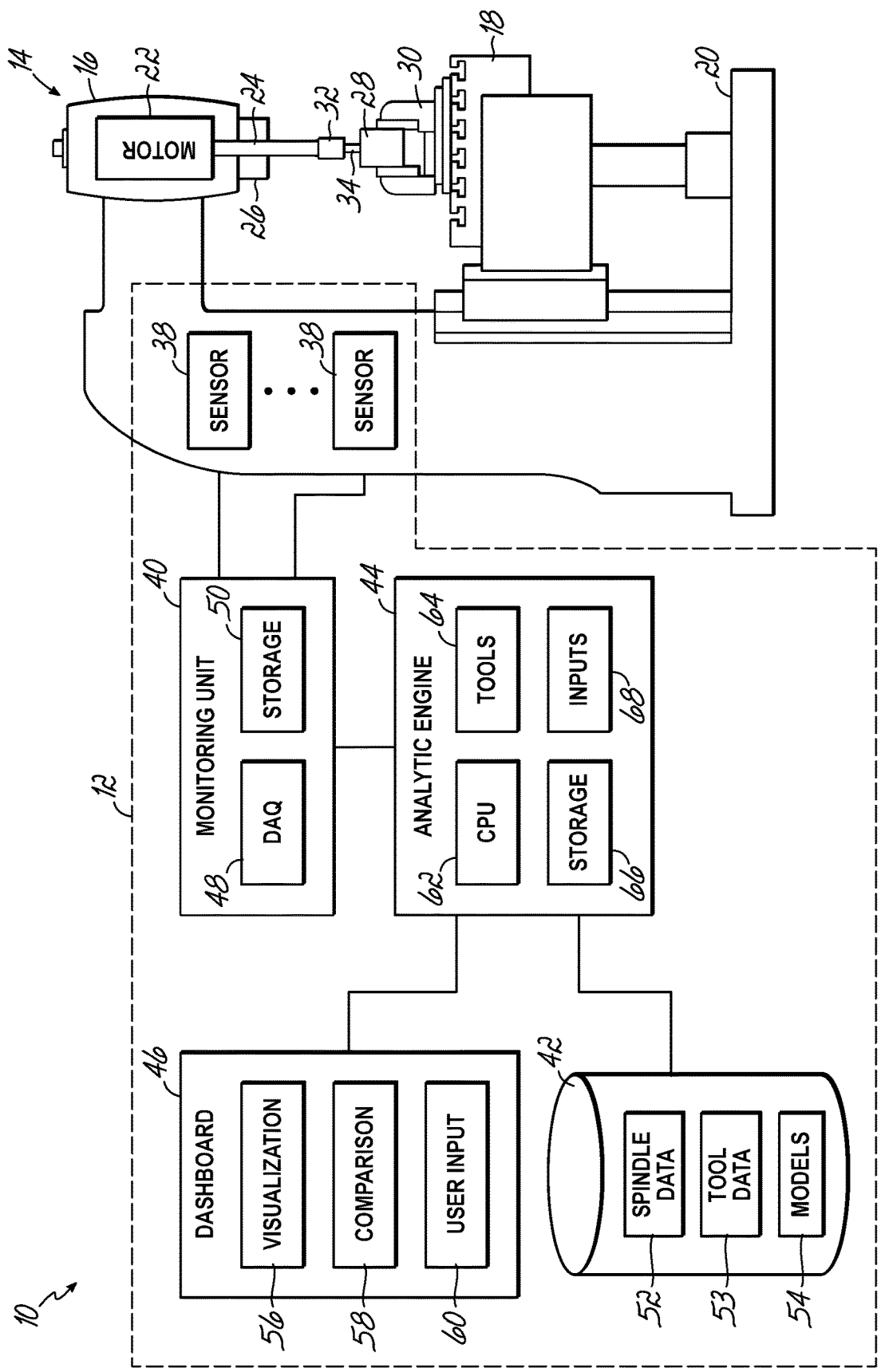
FIG. 1 is a diagrammatic view of an operating environment including a monitoring system and a machine monitored by the monitoring system.

It should be understood that the appended drawings are not necessarily to scale, and may present a somewhat simplified representation of various features illustrative of the basic principles of the invention. The specific design features of the sequence of operations disclosed herein, including, for example, specific dimensions, orientations, locations, and shapes of various illustrated components, may be determined in part by the particular intended application and use environment. Certain features of the illustrated embodiments may have been enlarged or distorted relative to others to facilitate visualization and a clear understanding. In particular, thin features may be thickened, for example, for clarity or illustration.

DETAILED DESCRIPTION

Embodiments of the present invention relate to systems, methods, and computer program products for monitoring the condition of cutting tools. The systems, methods, and computer program products may be used for, among other things, determining a health condition of a cutting tool during operation of a machine in which the tool is installed.

Embodiments of the present invention may involve collecting or otherwise defining a training dataset. Operational data may be generated using a non-destructive process that includes selectively removing inserts from the cutting tool, and collected on demand by measuring one or more of vibration and current signals with specific sensors operatively coupled to a data acquisition device while the cutting tool is rotated by a machine. The collected data may be preprocessed by one or more analytic engines that extract features from the data. The extracted features may be used to develop analytic tools for estimating the severity of any unbalance. The analytic tools may include any analytic tools that can be utilized for this specific application, including but not limited to self-organizing map/minimum quantization error (SOM-MQE) tools, as well as other machine learning and Deep Learning tools.

Embodiments of the present invention may also include a dashboard for visualization of the analytic results and for providing a user interface to the monitoring system. A network architecture may be used for monitoring different assets through a single dashboard. A central database may be configured to receive, store, and organize operational data, datasets, and analytic models for big data storage, model exchange, advanced analysis, models update, etc. The ability to monitor multiple machines through the dashboard and central database may facilitate peer-to-peer comparisons as well as collaborative model building and refinements.

Embodiments of the present invention may also include a monitoring system for monitoring spindle unbalance. The monitoring system may enable prediction of the level of unbalance for the spindle based on a designed analytic model. The monitoring system may also monitor tool unbalance, and determine of a level of unbalance for the cutting tool based on a designed analytic model.

FIG. 1 depicts an exemplary operating environment 10 for a monitoring system 12 that monitors a machine 14 (e.g., a machine tool) in accordance with an embodiment of the present invention. The exemplary machine 14 may include a machine head 16 and a table 18 that are operatively coupled to a frame 20. The machine head 16 may include a motor 22 operatively coupled to a spindle 24, and a spindle bearing 26 that allows the spindle 24 to rotate about an axis of the machine head 16. A workpiece 28 may be operatively coupled to the table 18 by a holder 30, e.g., a vise or clamp. The spindle 24 may include a tool holder 32 configured to receive a cutting tool 34. The cutting tool 34 may be configured to machine the workpiece 28 by selectively removing material therefrom to produce a product. The table 18 may be configured to move in one or more directions (x, y, z) or rotate along one or more axes (α, β, γ) relative to the frame 20 such that the workpiece 28 selectively engages the cutting tool 34. Although the exemplary machine 14 is depicted as a vertical cutting machine, embodiments of the invention are not so limited. Thus, it should be understood that other types of machines may be used, such as a horizontal cutting machine. In addition, the relative movement between the workpiece 28 and the cutting tool 34 may be achieved by moving the workpiece 28, the cutting tool 34, or both the workpiece 28 and the cutting tool 34 relative to a stationary frame of reference, e.g., the frame 20 of machine 14.

The monitoring system 12 may include one or more sensors 38, a monitoring unit 40, a historical information database 42, an analytic engine 44, and a dashboard 46. The one or more sensors 38 may be configured to generate signals indicative of a position, orientation, or movement of the table 18 relative to the cutting tool 34, power consumption or output of the motor 22 (e.g., voltage, current, torque, or rotational velocity), vibration in or proximate to the spindle bearing 26, the force or feed rate with which the cutting tool 34 is engaging the workpiece 28, or any other suitable operational parameter of the machine 14. Sensors 38 may be installed on the equipment specifically for the purpose of generating data for the monitoring system 12, or may be part of a system normally included in the machine 14, such as for controlling the machine 14. Additional operational parameters may be provided to the monitoring system 12 by the user, such as the material from which the workpiece 28 is made, the type of cutting tool 34 or cutting lubricant being used, or any other suitable operational parameters. In an embodiment of the invention, the monitoring system 12 may receive a vibration signal from the spindle 24 with a predefined sampling frequency while the spindle 24 is rotating at a specific rotational speed during offline operation of the machine 14.

The monitoring unit 40 may include a data acquisition module 48 and a storage module 50. The data acquisition module 48 may be configured to receive signals generated by the sensors 38, and output data indicative of information provided by the signals. For example, the data acquisition module 48 may sample each signal received from a respective sensor 38, and convert each sample from an analog value (e.g., a voltage or current) to a digital value (e.g., a binary number). These digital values may comprise digital data indicative of the value of the sampled analog signal at the sampling time, and thus define a characteristic of the operational parameter monitored by the sensor 38. This digital data may be stored locally in the storage module 50 (which may act as a memory buffer), transmitted to the analytic engine 44, or both stored locally and transmitted to the analytic engine 44.

The historical information database 42 may include spindle unbalance data 52, tool unbalance data 53, and analytic models 54 for determining spindle and tool condition. The analytic models 54 may comprise neural network or other machine learning models that have been trained, at least in part, using the spindle unbalance data 52 and tool unbalance data 53. The analytic models 54 may thereby be configured to provide a condition of the machine component (e.g., the level of unbalance of the spindle 24 or cutting tool 34) based on operational parameter data received from the monitoring unit 40.

The dashboard 46 may provide a user interface for the monitoring system 12, and may include a visualization module 56, a comparison module 58, and a user input module 60. The visualization module 56 may be configured to present analytic results received from the analytic engine 44 for display to a system user. The comparison module 58 may be configured to allow the user to compare analytic results received at different times or generated for different machines 14. The user input module 60 may be configured to receive user input, such as commands for selecting data for visualization or comparison. The dashboard 46 may thereby provide a simple and user-friendly user interface for visualization, model updates, and adjustments.

The analytic engine 44 may be responsible for analyzing operational data and generating health condition data. To this end, the analytic engine 44 may include a central processing unit 62, analytic tools 64, data storage 66, and inputs 68. The analytic tools 64 may include different tools, such as tools that enable the use of self-organizing maps and mean quantization errors. The inputs 68 may include, for example, operational data received from the monitoring unit 40, spindle unbalance data 52, tool unbalance data 53, analytic models 54 received from the historical information database 42, or user input received from the dashboard 46.

Figure 2A:
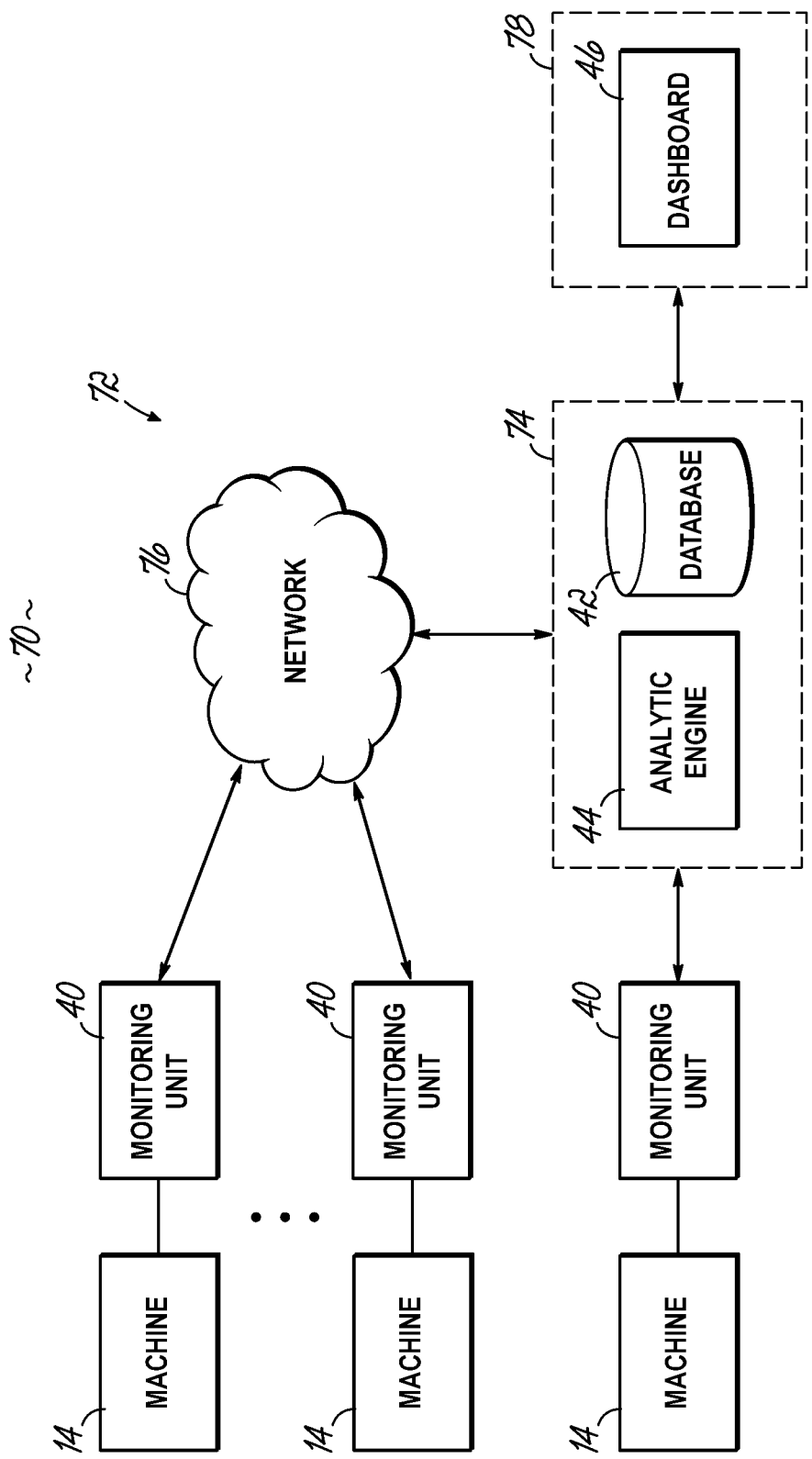
FIG. 2A is a diagrammatic view of a network architecture for connecting a plurality of monitoring systems to a computing system including a central database and an analytic engine.

FIG. 2A depicts another exemplary operating environment 70 in accordance with an embodiment of the present invention. The operating environment 70 includes a monitoring system 72 configured to monitor a plurality of machines 14. Each machine 14 may be in communication with a respective monitoring unit 40 that collects operational data from the machine 14. The monitoring units 40 may be in communication with a computing system 74 (e.g., an edge computing system) that hosts the historical information database 42 and analytic engine 44. Each monitoring unit 40 may thereby upload operational data to the historical information database 42 or analytic engine 44, either through an external network 76 (e.g., the Internet) or a local connection. The historical information database 42 may provide a central hub for data storage and analytic models based on operational data received from multiple monitoring units 40. A computing device 78 (e.g., a desktop computer, laptop computer, tablet computer, or smart phone of a system user) may be communication with the computing system 74, and may host an application that provides the dashboard 46. The monitoring system 72 may thereby connect a network of machines 14 to each other for data storage, analytic model updates and exchanges, peer-to-peer comparison, etc.

The historical information database 42 may be used to aggregate operational data from multiple machines 14, each of which may be operating with tools having a different health condition. This operational data may be used to generate a life cycle trajectory for one or more of the machines 14. The analytic engine 44 may utilize life cycle trajectories from multiple machines 14 to define a global analytic model 54. Moreover, the analytic engine 44 may constantly assess the performance of the analytic model 54 over time to see if the analytic model 54 needs updating. If so, the analytic engine 44 may automatically use a subset of the life cycle trajectories to update an existing analytic model 54 or define a new analytic model 54.

The life cycle data may comprise operational data collected during the normal operation of each machine 14 over the life of the cutting tool 34. The initial analytic model 54 may be built based on an accelerated life cycle test, and the subsequent models may be generated automatically through peer-to-peer comparison and using natural degradation patterns collected over time. Through this process, embodiments of the monitoring system 72 may provide automatic updates and sustainable models that handle data and model drift over time.

Figure 2B:
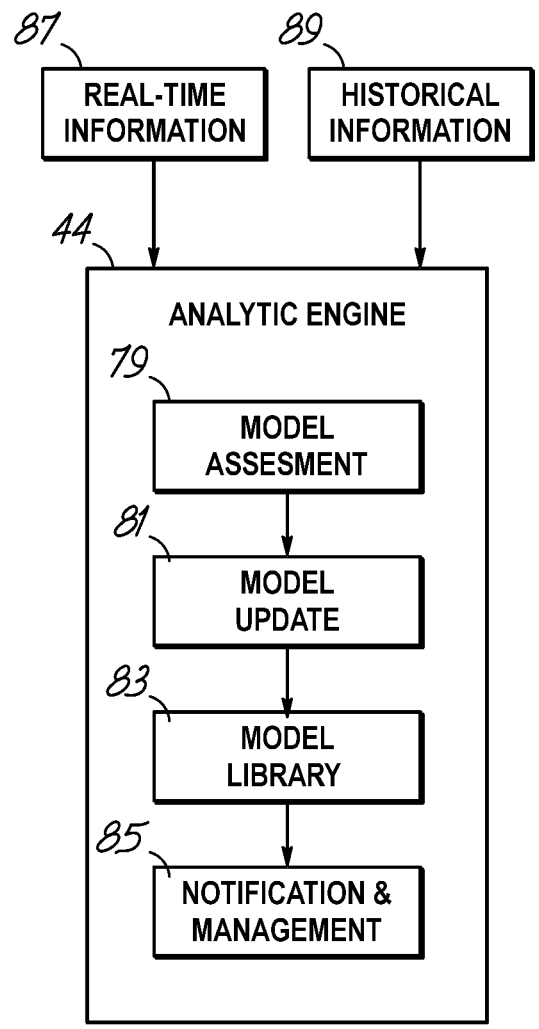
FIG. 2B is a diagrammatic view showing additional details of the analytic engine of FIG. 2A.

Referring now to FIG. 2B, the analytic engine 44 may include an analytic model assessment module 79, an analytic model update module 81, an analytic model library 83, and a notification and management module 85. The analytic engine 44 may receive operational data in the form of real-time information 87 and historical information 89, e.g., from one or more of the monitoring units 40 and the historical information database 42. The analytic engine 44 may thereby monitor multiple machines 14 from a central location, aggregate operational data from the machines 14 over the respective life cycles of their tools, perform peer-to-peer comparisons, and automatically update the analytic models 54 based on the operational data collected.

The model assessment module 79 may perform a series of tests on the operational data received from the monitoring units 40 and historical information database 42, and detect analytic model drift or poor performance. The model assessment module 79 may then determine if the reason for the drift or poor performance of the analytic model is due to one or more of operational data drift, sensor errors, and analytic model errors. The model update module 79 may be configured to generate one or more new training datasets from the operational data in the historical information database 42 (as well as new testing and validation datasets, if needed), and retrain the analytic model 54. The analytic model library 83 may track the analytic models 54 deployed over time along with their metadata, which may include an amount of time over which the analytic model 54 has been used, the performance of the analytic model 54, one or more reasons for a failure of the analytic model 54, new updates applied to the analytic model 54, etc. A notification and management module 85 may inform users of any changes applied to the analytic model 54 and any required next steps.

Figure 3C:
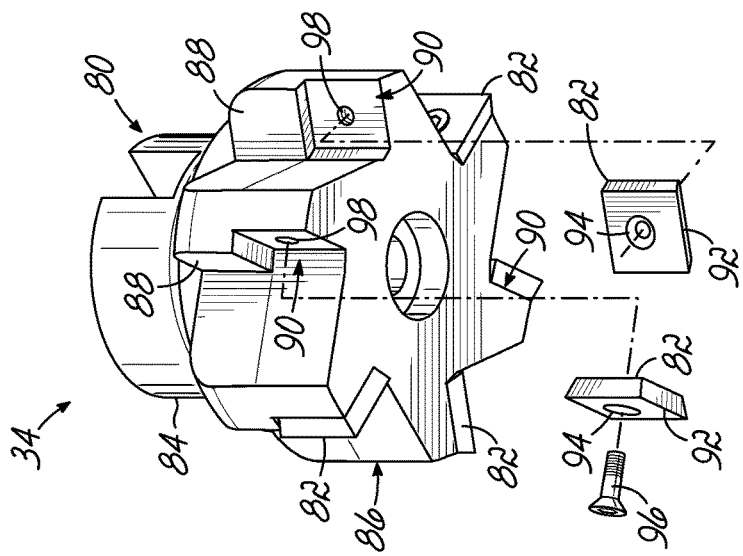
FIGS. 3A-3C are isometric views of an exemplary tool in each of three different simulated health conditions.
Figure 3B:
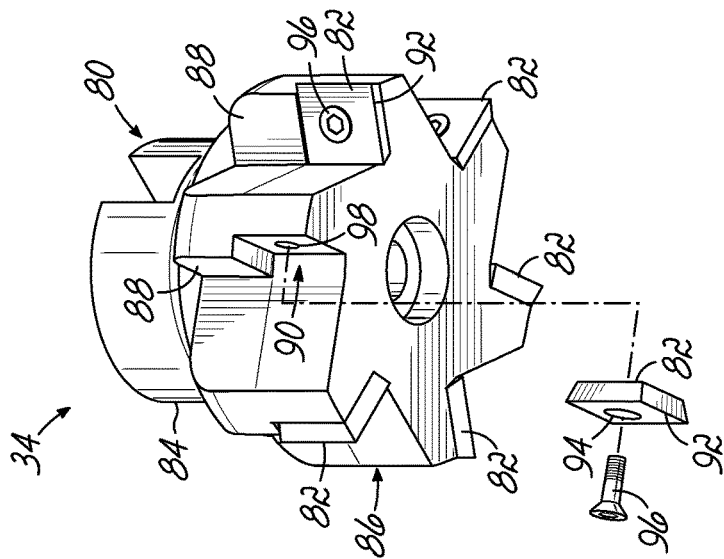
Figure 3A:
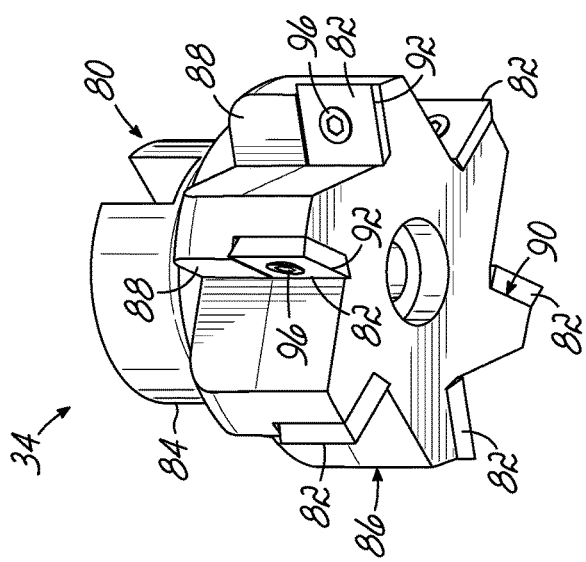

FIGS. 3A-3C depict an exemplary cutting tool 34 in accordance with an embodiment of the invention. The cutting tool 34 includes a body 80 and a plurality of inserts 82. The body 80 of cutting tool 34 may be made from any suitable material (e.g., steel), and includes a shank 84 and a head 86. The shank 84 may be configured to engage the tool holder 32 of machine 14. The head 86 may include plurality of front surfaces 88. Each front surface 88 may include a pocket 90 defined therein. Each insert 82 may be made from any suitable material (e.g., carbide) and include a cutting edge 92 and a bore 94 configured to receive a fastener 96 (e.g., a screw). Each pocket 90 may be configured to receive a respective insert 82, and include one or more threaded bores 98 (e.g., one threaded bore) configured to receive a threaded portion of the fastener 96. It should be understood that embodiments of the invention are not limited to the exemplary cutting tool 34 depicted, and other types of cutting tools (e.g., end mills, face mills, fly cutters, thread mills, drill bits, reamers, hollow mills, side-and-face cutters, gear cutters, slab mills, or any other suitable tools) may also be used.

One or more health conditions having different severity levels may be simulated in order to train an analytic model to identify tool defects or other health conditions based on operational data collected from the sensors 38. In an embodiment of the invention, a non-destructive approach may be used in which these different severity levels are created by removing one or more inserts from an otherwise balanced cutting tool 34. For example, as shown by FIG. 3B, one insert 82 may be removed to simulate a low severity health condition. As shown by FIG. 3C, two inserts 82 may be removed to simulate a high severity health condition. When multiple inserts are removed, the inserts may be removed from adjacent pockets (as shown) to maximize an unbalance of the cutting tool 34, or may be removed from non-adjacent pockets to simulate other health conditions. Data collected while the cutting tool 34 has one insert removed may be classified as "unbalanced level 1", data collected while the cutting tool 34 has two inserts removed may be classified as "unbalanced level 2", and so forth. Levels of insert removal having different pockets 90 from which the inserts 82 have been removed may be given a suffix (e.g., unbalance level 1A, 1B, 2A, 2B, etc) in order to distinguish those conditions within an unbalance level.

Figure 4:
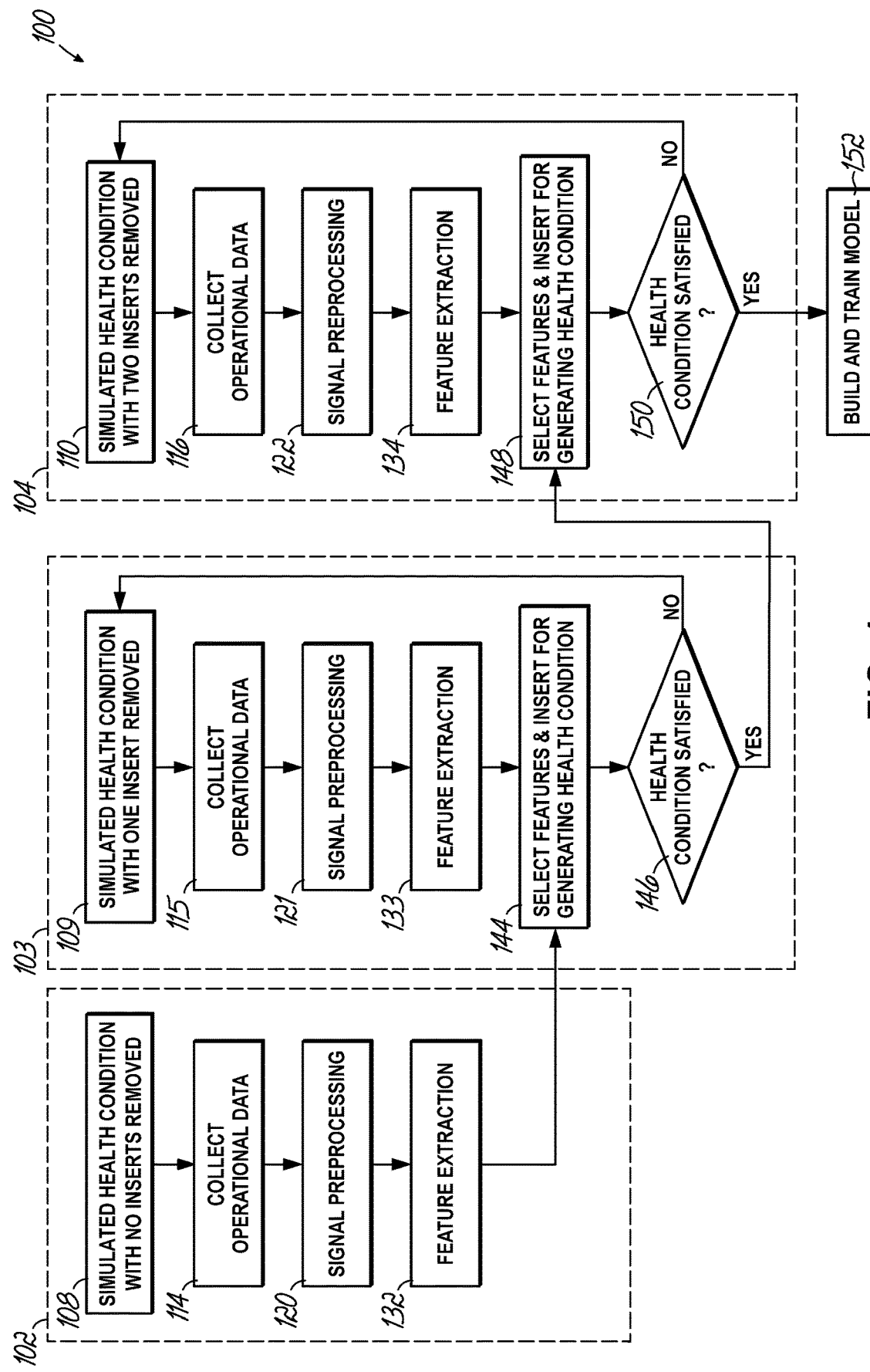
FIG. 4 is a flowchart of a process for generating model building and training datasets using the tool depicted in FIGS. 3A-3C.

FIG. 4 depicts a flowchart illustrating an exemplary process 100 for generating model building and training datasets. The process 100 may include one or more subprocesses 102-104 for each of a plurality of simulated health conditions, e.g., no inserts removed, one insert removed, and two inserts removed. The health condition subprocesses 102-104 may be used to generate training datasets for building and training analytic models that determine the health condition of the cutting tool 34. In block 108, a known health condition corresponding to a balanced cutting tool 34 may be simulated by using the cutting tool 34 with inserts 82 operatively coupled to each of the pockets 90 (i.e., no inserts removed) as shown in FIG. 3A. In block 109, a known health condition corresponding to an unbalanced cutting tool 34 may be simulated by using the cutting tool 34 with one insert 82 removed as shown in FIG. 3B. In block 110, a known health condition corresponding to an unbalanced cutting tool 34 may be simulated by using the cutting tool 34 with two inserts 82 removed as shown in FIG. 3C. It should be understood that the above health condition simulations are exemplary only, and different numbers of simulated health conditions, as well as simulated health conditions corresponding to different numbers and positions of removed inserts 82, may also be used. Thus, embodiments of the invention are not limited to the exemplary simulated health conditions depicted.

In blocks 114-116, each of the subprocesses 102-104 may collect operational data from the machine 14 while the machine 14 is operated with the cutting tool 34 in a respective simulated health condition 108-109 and the spindle is rotated at a constant speed, with either the cutting tool 34 spinning freely or being used to remove material from a test workpiece 28. In response to receiving their respective operational data, each subprocess 102-104 may proceed to respective blocks 120-122 and perform signal preprocessing on their respective operational datasets.

Referring now to FIG. 5, and with continued reference to FIG. 4, each of the signal preprocessing blocks 120-122 may include signal windowing for sample generation (block 126), outlier removal from the generated samples (block 128), and noise filtering (block 130). Signal samples from one or more windows of time may comprise a dataset. Once the signals have been processed into datasets (e.g., by one or more of sampling, outlier removal, and filtering), each subprocess 102-104 may proceed to respective blocks 132-134 and extract features from the datasets.

Referring now to FIG. 6, and with continued reference to FIG. 4, in blocks 132-134, each respective subprocess 102-104 may use feature extraction algorithms to decompose the respective datasets into a feature space that can be used to determine the health condition of the cutting tool 34. As used herein, the term "feature" may refer to a particular characteristic of the dataset generated from one or more signals received from one or more sensors 38. General categories of features that may be extracted from the datasets for use in fault diagnosis and determining health conditions of the tool may include frequency domain features (block 138), time domain features (block 140), and time-frequency domain features (block 142). Exemplary methods for extracting these types of features are described below. Feature extraction, analysis, and model building are also described in detail by U.S. Pat. No. 8,301,406, issued on Oct. 30, 2012, the disclosure of which is incorporated by reference herein in its entirety.

In block 144, the subprocess 103 may select features extracted from the operational data for each of the simulated health conditions provided by the different insert configurations in blocks 108 and 109, and determine a health condition based thereon, e.g., by comparing one or more characteristics of the selected features. Features may be selected, for example, based on the magnitude of the difference in the values of the same type of features (i.e., "like features") extracted from operational datasets from different simulated health conditions. Types of features having relatively larger differences may be selected for use over features having relatively smaller differences.

Once the features have been selected and the health condition determined, the subprocess 103 may proceed to block 146 and determine if the result of the comparison (e.g., the output of the analytic model) satisfies the health condition. The health condition may be satisfied, for example, if the characteristic of the selected feature associated with the simulated health condition of block 109 is sufficiently different than the characteristic of the selected feature associated with the simulated health condition of block 108, e.g., is the unbalance level one value $U_1$ greater than the baseline health value H for the healthy state ($U_1$>H) for that feature. By way of example, for a level one value $U_1$ based on the amplitude of a frequency domain feature extracted in block 133, the simulated health may be sufficiently different if the level one value $U_1$ is greater than the amplitude of the baseline health value H based on the same frequency domain feature extracted in block 132, such that $U_1$>H+$U_{TH\_1}$, where $U_{TH\_1}$ is a threshold value.

If the health condition is not satisfied ("NO" branch of decision block 146), the subprocess 103 may return to block 109 and repeat the process of selecting and comparing features until suitable features are identified for defining the unbalance level one value $U_1$. If the health condition is satisfied ("YES" branch of decision block 146), the subprocess 103 may proceed to block 148 of subprocess 104.

In block 148, the subprocess 104 may select features extracted from the data for each of the simulated health conditions provided by the different insert configurations in blocks 109 and 110, and generate a health condition based thereon, e.g., by comparing one or more characteristics of the selected features. The subprocess 103 may then proceed to block 150 and determine if a health condition is satisfied. The health condition may be satisfied if the characteristic of the selected feature associated with the simulated health condition of block 110 is sufficiently different than the characteristic of the selected feature associated with the simulated health condition of block 109, e.g., is the unbalance level two value $U_2$ greater than the unbalance level one value ($U_2$>$U_1$). By way of example, for a level two value $U_2$ based on the amplitude of a frequency domain feature extracted in block 134, the simulated health may be sufficiently different if the level two value $U_2$ is greater than the amplitude of the level one value $U_1$ based on the same frequency domain feature extracted in block 134, such that $U_2$>$U_1$+$U_{TH\_2}$, where $U_{TH\_2}$ is another threshold value.

If the health condition is not satisfied ("NO" branch of decision block 150), the subprocess 104 may return to block 110 and repeat the process of selecting and comparing features until suitable features are identified for defining the unbalance level two value $U_2$. If the health condition is satisfied ("YES" branch of decision block 150), the subprocess 104 may proceed to block 152.

In block 152, the process 100 may build and train models using the features extracted by each of the subprocesses 102-104. The model building may use self-organizing map/minimum quantization error or any other suitable machine learning method, such as a deep belief network (DBN) or other deep learning method. Building models may include providing values of the selected features in the training datasets to an analytic model. The analytic model may include one or more weight vectors that weigh the values of the features input into the model and/or the outputs of one or more neurons of the analytic model. The training process may include adjusting these weights to achieve an output that indicates the correct simulated health condition based on training datasets generated under known health conditions.

Figure 7:
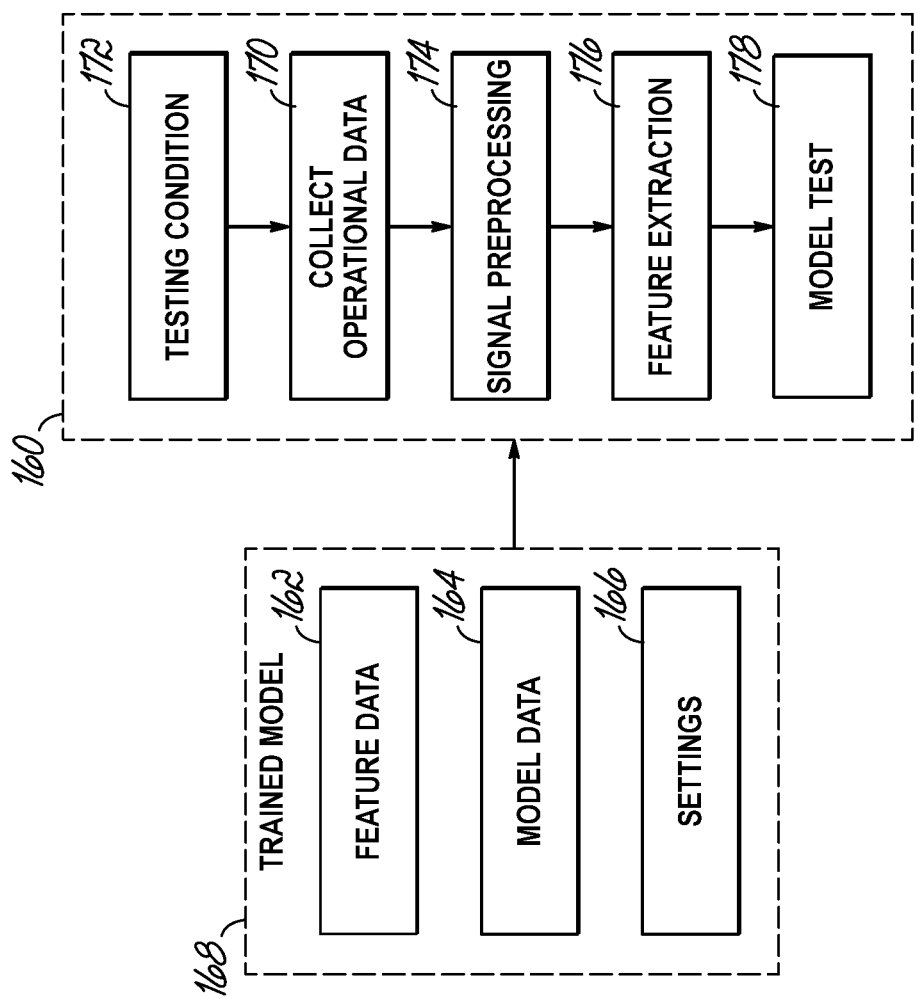
FIG. 7 is a flowchart of a process that monitors the health of the cutting tool during operation of the machine of FIG. 1.

FIG. 7 depicts a flowchart illustrating a model testing process 160 that monitors cutting tool health during operation of the machine 14 using a cutting tool 34 having a known health condition. The process 160 may receive feature data 162, model data 164, and settings 166 from a trained model 168, e.g., a model trained in block 152 of process 100. In block 170, the process 160 may collect operational data from the machine 14 while it is operating in a test condition 172, e.g., with the cutting tool 34 in one of the health conditions 108-110 of process 100. In block 174, the process 160 may perform signal preprocessing on the operational data. In block 176, the process 160 may use feature extraction algorithms to decompose the preprocessed dataset into a feature space that can be used to predict the health of the cutting tool 34. In block 178, the extracted features may be provided to the trained model 168 to determine the health of the cutting tool 34. The determined health condition may be compared to the known health condition of the cutting tool 34 to test the trained model 168.

As noted above, general categories of features that may be extracted from the datasets may include frequency, time, and time-frequency domain features. By way of example, one time domain feature of a dataset may be the maximum amplitude of the dataset within a given time period. Time domain analysis may be used to analyze stochastic datasets in the time domain, and may involve the comparison of a real-time or collected dataset to a stored dataset.

Frequency domain analysis may include applying a Fourier transform (e.g., a Discrete Fourier Transform (DFT)) to the dataset to separate the waveform into a sum of sinusoids of different frequencies. Other frequency domain analysis tools that may be used to extract features from datasets may include envelope analysis, frequency filters, side band structure analysis, the Hilbert transform, Cepstrum analysis, and wavelet analysis.

One type of time-frequency domain analysis involves using a wavelet transform to generate wavelets that represent a time signal in terms of a finite length or fast decaying oscillating waveform which is scaled and translated to match the input signals represented by the datasets. Wavelet packet analysis may enable extraction of features from datasets that combine non-stationary and stationary characteristics. The resulting representation may contain information both in time and frequency domain, and may achieve better resolution than either a time based analysis or a frequency based analysis.

Specific time domain features that may be extracted from each dataset may include mean, root mean square (RMS), kurtosis, crest factor, skewness, and entropy values. The mean $\bar{x}$ of a dataset comprising a series of N samples ($x_1$, $x_2$, ... $x_n$) may be provided by:

$$\bar{x} = \frac{1}{N}\sum_i^N x_i \qquad \text{Eqn. 1}$$

The RMS of the dataset may be provided by:

$$RMS = \sqrt{\frac{\sum_i^N (x_i - \bar{x})^2}{N}} \qquad \text{Eqn. 2}$$

The kurtosis of the dataset may be provided by:

$$\frac{\sum_i^N (x_i - \bar{x})^4}{N \times RMS^4} \qquad \text{Eqn. 3}$$

The crest factor of the dataset may be provided by:

$$\frac{\max(x_i) - \min(x_i)}{RMS} \qquad \text{Eqn. 4}$$

The skewness of the dataset may be provided by:

$$\frac{\sum_i^N (x_i - \bar{x})^3}{N \times RMS^3} \qquad \text{Eqn. 5}$$

And the entropy of the dataset may be provided by:

$$-\sum_{i=1}^N (x_i \log(x_i)) \qquad \text{Eqn. 6}$$

A Fourier transform may be used to separate a dataset into a sum of sinusoids of different frequencies for frequency analysis. When dealing with a discrete signal, the Discrete Fourier Transform (DFT) may be used to provide the time-to-frequency transformation. The forward DFT of a finite-duration dataset x[n] (with N samples) may be provided by:

$$X(k) = \sum_{n=0}^{N-1} x[n]e^{-i2\pi\frac{kn}{N}} = \sum_{n=0}^{N-1} x[n] \times \left[\cos\left(\frac{2\pi}{N}kn\right) - i \times \sin\left(\frac{2\pi}{N}kn\right)\right] \qquad \text{Eqn. 7}$$

In practice, the DFT may be computed more efficiently using a Fast-Fourier Transform (FFT) algorithm.

The Fourier transform translates datasets representing sampled time domain signals received from sensors 38 into the equivalent frequency domain representation. The resulting frequency spectrum may be subdivided into a specific number of sub-bands. By way of example, the center frequency of each sub-band may be pre-defined as tool health indicator frequency. The energy in each sub-band may be determined and used to determine the health of the tool (block 118 of subprocess 110) or build and validate an analytic model (block 128 of subprocess 120), for example.

The Hilbert transform may be used for further analysis of a signal on a certain characteristic frequency. The Hilbert transform is defined as:

$$H|x(t)| = \frac{1}{\pi}\int_{-\infty}^{\infty} \frac{x(t)}{t-\tau} d\tau \qquad \text{Eqn. 8}$$

where $\tau$ is a dummy time variable, x(t) is the time domain signal, and H|x(t)| is the Hilbert transform of x(t).

Sustained mechanical defects often produce narrow-band signals. Thus, a Fourier-based analysis may be useful for extraction of these features. For intermittent defects, signals may demonstrate a non-stationary and transient nature. Wave packet analysis may provide useful tools for detecting these types of intermittent defects. For example, a wavelet packet transform using a library of redundant base wavelets with arbitrary time and frequency resolution may enable the extraction of features from signals that combine non-stationary and stationary characteristics. Wave packet analysis may rely on a wavelet transform that provides a complete level-by-level decomposition of the signal being analyzed. The wavelet packets may be particular linear combinations of wavelets that inherit properties such as orthogonality, smoothness, and time-frequency localization from their corresponding wavelet functions.

A wavelet packet may be represented by a function having three indices:

$$\psi_{j,k}^i(t) \qquad \text{Eqn. 9}$$

where i is an oscillation parameter, j is a scale parameter, and k is a translation parameter. The wavelet packet function may be represented by the following equation:

$$\psi_{j,k}^i(t) = 2^{\frac{j}{2}}\psi^i(2^j t - k) \qquad \text{Eqn. 10}$$

The first wavelet may be referred to as a "mother wavelet". Wavelets for i=2, 3, . . . may be provided by the following recursive relationships:

$$\psi^{2i}(t) = \sqrt{2} \sum_{-\infty}^{\infty} h(k)\psi^i(2t-k) \qquad \text{Eqn. 11}$$

and $$\psi^{2i+1}(t) = \sqrt{2} \sum_{-\infty}^{\infty} g(k)\psi^i(2t-k) \qquad \text{Eqn. 12}$$

where h(k) and g(k) are the quadrature mirror filters associated with the predefined scaling function and the mother wavelet function. The wavelet packet coefficients of a function $f$ may be computed by taking the inner product of the signal and the particular basis function as shown by:

$$c_{j,k}^i = \left\langle f, \psi_{j,k}^i(t) \right\rangle = \int_{-\infty}^{\infty} f(t)\psi_{j,k}^i(t)dt \qquad \text{Eqn. 13}$$

The wavelet packet node energy $e_{j,k}$ may be defined as:

$$e_{j,k} = \sum_k c_{j,k}^{i2} \qquad \text{Eqn. 14}$$

The wavelet packet node energies may be used as the input feature space for performance assessments based on wavelet packet analysis. Wavelet packet analysis may be applied to extract features from the non-stationary vibration data. Other types of analyzing wavelet functions may also be used.

The tool health monitoring models may be built using a self-organizing map machine learning model, and employ minimum quantization error to identify matching input vectors. Self-organizing maps may be used to convert complex relationships in a high-dimensional input space into simple geometric relationships on a low-dimensional output space while preserving the topology. The term "self-organizing" refers to the ability of the underlying neural network to organize itself according to the nature of the input data. The input data vectors may closely resemble each other, and may be located next to each other on the map after training. An n-dimensional input data space x may be denoted by:

$$x=[x_1, x_2, \ldots x_n]^T \qquad \text{Eqn. 15}$$

Each neuron j in the neural network may be associated with a weight vector $w_j$ having the same dimension as the input space x:

$$w_j=[w_{j1}, w_{j2}, \ldots w_{jn}]^T \qquad \text{Eqn. 16}$$

where j=1, 2, . . . m, and m is the number of neurons in the neural network.

A best matching unit in the self-organizing map may be defined as the neuron whose weight vector $w_j$ is closest to the input vector in the input data space x. The Euclidean distance may provide a convenient measure criterion for matching x with $w_j$, with the minimum distance defining the best matching unit. If $w_c$ is defined as the weight vector of the neuron that best matches the input vector x, the measure can be represented by:

$$\|x-w_c\|=\min\{\|x-w_j\|\}, j=1,2,\ldots,m \qquad \text{Eqn. 17}$$

After the best matching unit is identified in the iterative training process, the weight vectors and the topological neighbors of the best matching unit may be updated in order to move them closer to the input vector in the input space. The following learning rule may then be applied:

$$w_j(t+1)=w_j(t)+\alpha(t)h_{j,w_c}(t)(x-w_j(t)) \qquad \text{Eqn. 18}$$

where t is the iteration step, and $h_{j,w_c}$ denotes the topological neighborhood kernel centered on the best matching unit $w_c$. In an embodiment of the invention, the Gaussian function may be used for the kernel function, as shown by:

$$h_{j,w_c} = \exp\left(\frac{-d_{j,w_c}^2}{2\sigma^2}\right) \qquad \text{Eqn. 19}$$

where $d_{j,w_c}$ is the lateral distance between the best matching unit $w_c$ and neuron j. The parameter a may be the "effective width" of the topological neighborhood, and $\alpha(t)$ may be the learning rate, which may be monotonically decreasing with training time. In the initial phase, which may last for a predetermined number of steps (e.g., the first 1000 steps), $\alpha(t)$ may start with a value that is close to 1, and may be linear, exponential, or inversely proportional to t. During a fine-adjustment phase, which may last for the rest of the training, $\alpha(t)$ may keep small values over a long time.

In some cases, only measurement of the normal operating conditions may be available. Under these conditions, a self-organizing map may provide a performance index to evaluate a degradation condition. For each input feature vector, a best matching unit may be found in the self-organizing map trained only with the measurement in the normal operating state. A minimum quantization error may be defined as a distance between the input feature vector and the weight vector of the best matching unit. The minimum quantization error may actually indicate how far away the input feature vector deviates from the normal operating state. The minimum quantization error MQE may be more particularly defined as:

$$\text{MQE}=\|V_F-V_{BMU}\| \qquad \text{Eqn. 20}$$

where $V_F$ is the input feature vector, and $V_{BMU}$ is the weight vector of the best matching unit. The degradation trend may thereby be measured by the trend of the minimum quantization error.

Figure 8:
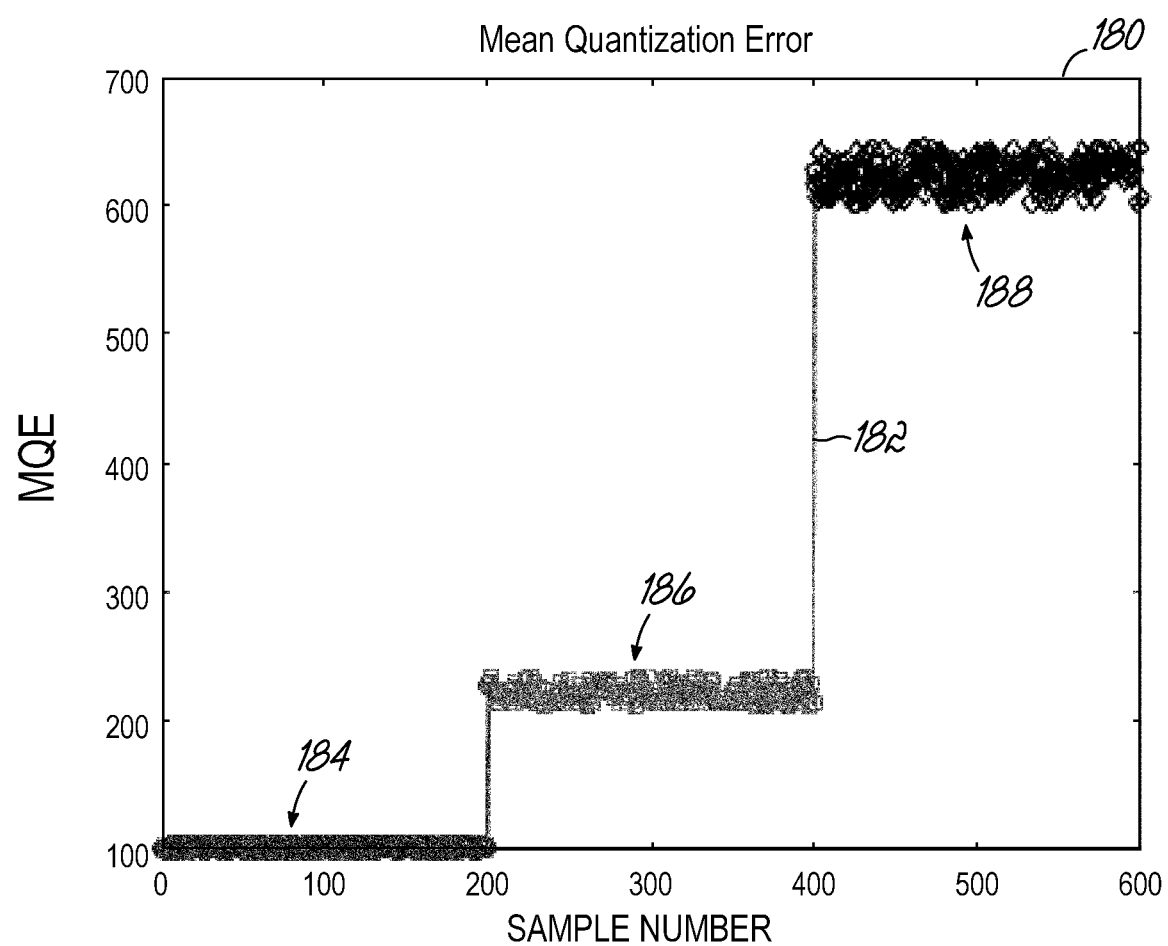
FIG. 8 is a graphical view illustrating minimum quantization error MQE versus sample number for a baseline health value, a fault region associated with a low severity fault state, and a fault region associated with a high severity fault state.

FIG. 8 depicts a graph 180 including a plot 182 of minimum quantization error MQE versus sample number. The MQE in a baseline region 184 is associated with the baseline health value H corresponding to healthy state associated with a balanced cutting tool 34. The MQE in fault region 186 is associated with an unbalance level one value $U_1$ corresponding to a low severity fault state associated with an unbalanced cutting tool 34. The MQE in fault region 188 is associated with an unbalance level two value $U_2$ corresponding to a high severity fault state associated with a highly unbalanced cutting tool 34. As can be seen, the MQE provides a clear distinction between the health conditions tested.

Figure 9:
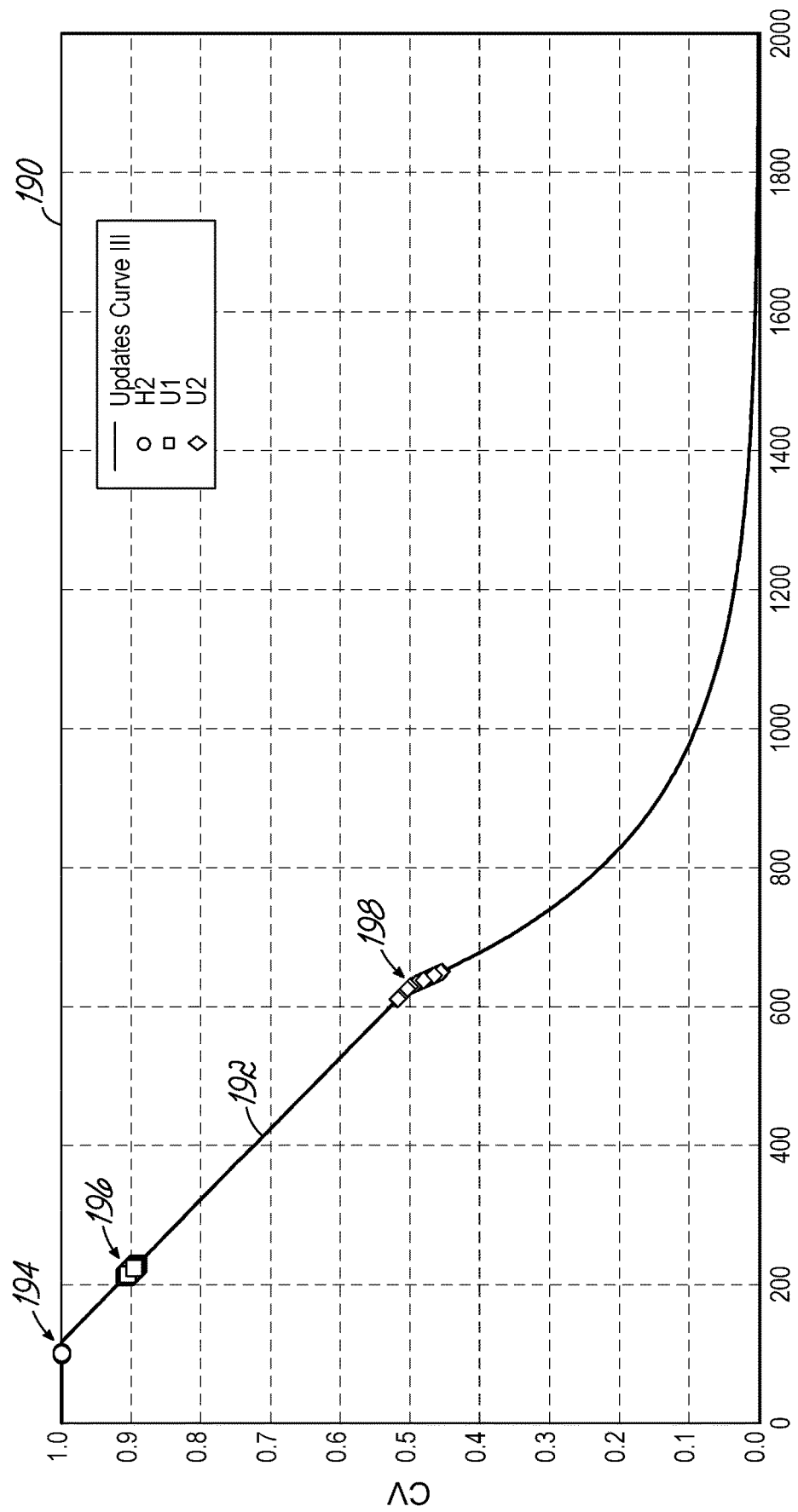
FIG. 9 is a graphical view 190 illustrating of a coefficient of variation (CV) verses minimum quantization error MQE for the baseline and fault regions of FIG. 8.

FIG. 9 depicts a graph 190 including a plot 192 of a coefficient of variation (CV) verses minimum quantization error MQE. As can be seen, the coefficient of variation of the baseline data 194 is about 1.00. As the severity of the fault increases, the CV decreases, with the CV of the unbalance level one data 196 having values in a range of about 0.89-0.91, and the CV of the unbalance level two data 198 having values in a range of about 0.45-0.52. The analytics model may evaluate the deviation from the baseline healthy condition. Different methods including SOM-MQE can be used. The unbounded deviation score may be mapped into a bounded conformance value representing the unbalance health score of the spindle 24 of machine 14.

A tool health assessment may be used to evaluate an overlap between the feature vector input into the analytic model, and the feature vector extracted from datasets generated during normal operation of the machine 14. A quantitative measure may be calculated to indicate degradation of the health condition of the cutting tool 34. To this end, the self-organizing map may be used to generate a performance index to evaluate the health condition of the cutting tool 34 based on a deviation from the baseline health condition. The self-organizing map may provide a classification and visualization tool which can convert a multidimensional feature space into a one or two-dimensional space, such as a two-dimensional graph. One type of graph that may be generated using the self-organizing map is commonly referred to as a "health map" in which different areas represent different failure modes for diagnosis purposes.

The developed analytics model may produce raw, unbounded scores that could theoretically have any value between zero and infinity. Graph 190 depicts an example of "unbounded data" scores. The unbounded data may be mapped onto a suitable function/piecewise curve that can take any value between zero and infinity as input. Plot 192 is an exemplary curve that follows this type of structure (e.g., flat linear, sloped linear, exponential decay), but the mapping curve can be designed in whatever way fits the problem/specifications of the user. The curve parameters may be calculated using the training data and user defined CV mapping values. These mapping values allow the user to assign a desired/expected health percentage to the different training health conditions (e.g., the faulty state (low severity) condition may be defined to correspond to a 90% health condition). The mapping function may be configured to output a value between zero and one, thus providing a CV health score within an accepted range. Graph 190 includes scatter plots 194, 196, 198 of these scores and the plot 192 of the underlying mapping curve. Any new scores that are generated on testing data can then be mapped using the trained mapping curve to get a value of the health condition as a bounded percentage.

Figure 10:
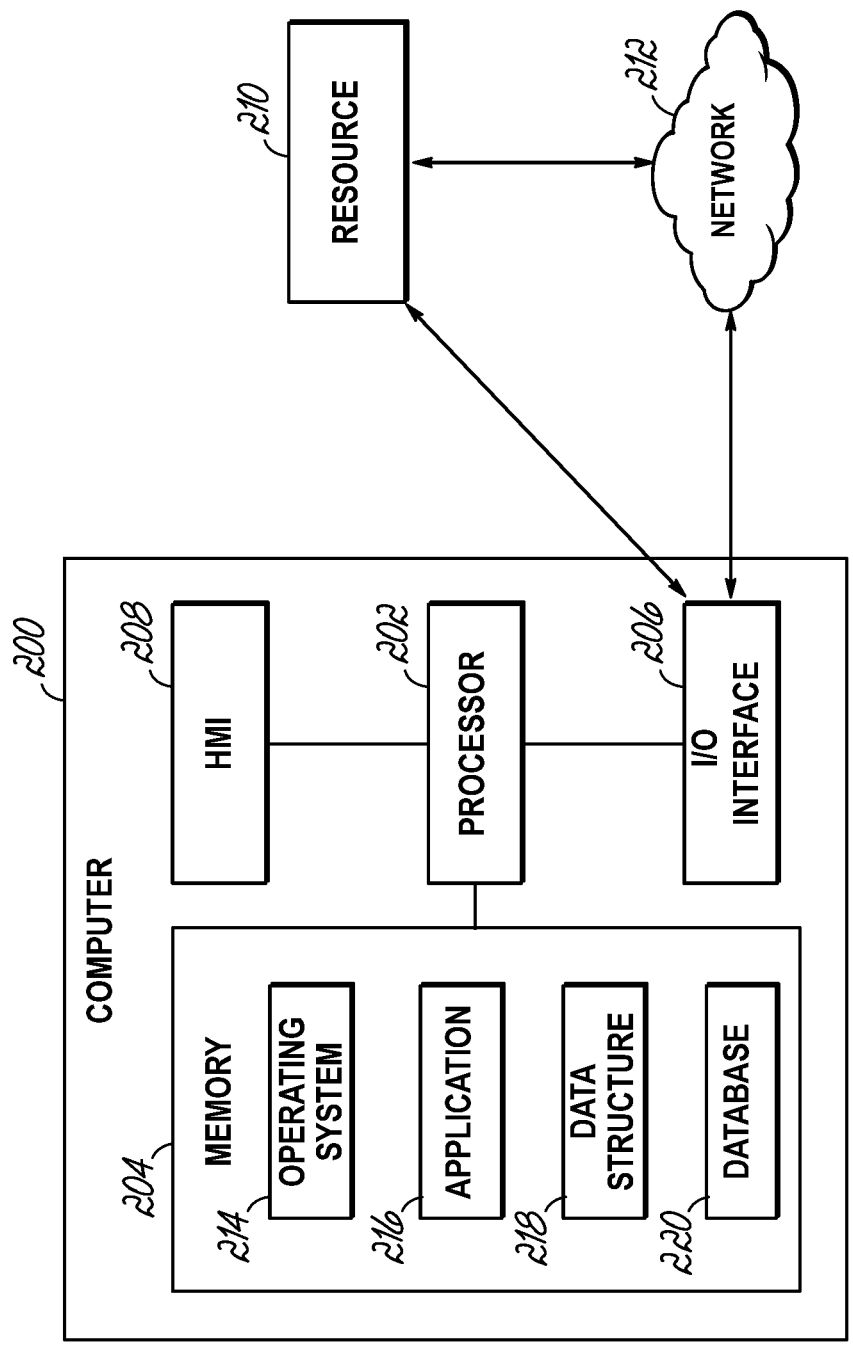
FIG. 10 is a diagrammatic view of a computer that may be used to implement one or more features depicted by FIGS. 1-9.

Referring now to FIG. 10, embodiments of the invention described above, or portions thereof, may be implemented using one or more computer devices or systems, such as exemplary computer 200. The computer 200 may include a processor 202, a memory 204, an input/output (I/O) interface 206, and a Human Machine Interface (HMI) 208. The computer 200 may also be operatively coupled to one or more external resources 210 via the network 212 or I/O interface 206. External resources may include, but are not limited to, servers, databases, mass storage devices, peripheral devices, cloud-based network services, or any other resource that may be used by the computer 200.

The processor 202 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions stored in memory 204. Memory 204 may include a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or data storage devices such as a hard drive, optical drive, tape drive, volatile or non-volatile solid state device, or any other device capable of storing data.

The processor 202 may operate under the control of an operating system 214 that resides in memory 204. The operating system 214 may manage computer resources so that computer program code embodied as one or more computer software applications, such as an application 216 residing in memory 204, may have instructions executed by the processor 202. One or more data structures 218 may also reside in memory 204, and may be used by the processor 202, operating system 214, or application 216 to store or manipulate data.

The I/O interface 206 may provide a machine interface that operatively couples the processor 202 to other devices and systems, such as the external resource 210 or the network 212. The application 216 may thereby work cooperatively with the external resource 210 or network 212 by communicating via the I/O interface 206 to provide the various features, functions, applications, processes, or modules comprising embodiments of the invention. The application 216 may also have program code that is executed by one or more external resources 210, or otherwise rely on functions or signals provided by other system or network components external to the computer 200. Indeed, given the nearly endless hardware and software configurations possible, persons having ordinary skill in the art will understand that embodiments of the invention may include applications that are located externally to the computer 200, distributed among multiple computers or other external resources 210, or provided by computing resources (hardware and software) that are provided as a service over the network 212, such as a cloud computing service.

The HMI 208 may be operatively coupled to the processor 202 of computer 200 to allow a user to interact directly with the computer 200. The HMI 208 may include video or alphanumeric displays, a touch screen, a speaker, and any other suitable audio and visual indicators capable of providing data to the user. The HMI 208 may also include input devices and controls such as an alphanumeric keyboard, a pointing device, keypads, pushbuttons, control knobs, microphones, etc., capable of accepting commands or input from the user and transmitting the entered input to the processor 202.

A database 220 may reside in memory 204, and may be used to collect and organize data used by the various systems and modules described herein. The database 220 may include data and supporting data structures that store and organize the data. In particular, the database 220 may be arranged with any database organization or structure including, but not limited to, a relational database, a hierarchical database, a network database, or combinations thereof. A database management system in the form of a computer software application executing as instructions on the processor 202 may be used to access the information or data stored in records of the database 220 in response to a query, which may be dynamically determined and executed by the operating system 214, other applications 216, or one or more modules.

In general, the routines executed to implement the embodiments of the invention, whether implemented as part of an operating system or a specific application, component, program, object, module or sequence of instructions, or a subset thereof, may be referred to herein as "program code." Program code typically comprises computer-readable instructions that are resident at various times in various memory and storage devices in a computer and that, when read and executed by one or more processors in a computer, cause that computer to perform the operations necessary to execute operations or elements embodying the various aspects of the embodiments of the invention. Computer-readable program instructions for carrying out operations of the embodiments of the invention may be, for example, assembly language, source code, or object code written in any combination of one or more programming languages.

Various program code described herein may be identified based upon the application within which it is implemented in specific embodiments of the invention. However, it should be appreciated that any particular program nomenclature which follows is used merely for convenience, and thus the invention should not be limited to use solely in any specific application identified or implied by such nomenclature. Furthermore, given the generally endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the embodiments of the invention are not limited to the specific organization and allocation of program functionality described herein.

The program code embodied in any of the applications/modules described herein is capable of being individually or collectively distributed as a computer program product in a variety of different forms. In particular, the program code may be distributed using a computer-readable storage medium having computer-readable program instructions thereon for causing a processor to carry out aspects of the embodiments of the invention.

Computer-readable storage media, which is inherently non-transitory, may include volatile and non-volatile, and removable and non-removable tangible media implemented in any method or technology for storage of data, such as computer-readable instructions, data structures, program modules, or other data. Computer-readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store data and which can be read by a computer. A computer-readable storage medium should not be construed as transitory signals per se (e.g., radio waves or other propagating electromagnetic waves, electromagnetic waves propagating through a transmission media such as a waveguide, or electrical signals transmitted through a wire). Computer-readable program instructions may be downloaded to a computer, another type of programmable data processing apparatus, or another device from a computer-readable storage medium or to an external computer or external storage device via a network.

Computer-readable program instructions stored in a computer-readable medium may be used to direct a computer, other types of programmable data processing apparatuses, or other devices to function in a particular manner, such that the instructions stored in the computer-readable medium produce an article of manufacture including instructions that implement the functions, acts, or operations specified in the text of the specification, the flowcharts, sequence diagrams, or block diagrams. The computer program instructions may be provided to one or more processors of a general purpose computer, a special purpose computer, or other programmable data processing apparatus to produce a machine, such that the instructions, which execute via the one or more processors, cause a series of computations to be performed to implement the functions, acts, or operations specified in the text of the specification, flowcharts, sequence diagrams, or block diagrams.

The flowcharts and block diagrams depicted in the figures illustrate the architecture, functionality, or operation of possible implementations of systems, methods, or computer program products according to various embodiments of the invention. In this regard, each block in the flowchart or block diagrams may represent a module, segment, or portion of instructions, which comprises one or more executable instructions for implementing the specified logical function or functions.

In certain alternative embodiments, the functions, acts, or operations specified in the text of the specification, the flowcharts, sequence diagrams, or block diagrams may be re-ordered, processed serially, or processed concurrently consistent with embodiments of the invention. Moreover, any of the flowcharts, sequence diagrams, or block diagrams may include more or fewer blocks than those illustrated consistent with embodiments of the invention. It should also be understood that each block of the block diagrams or flowcharts, or any combination of blocks in the block diagrams or flowcharts, may be implemented by a special purpose hardware-based system configured to perform the specified functions or acts, or carried out by a combination of special purpose hardware and computer instructions.

The terminology used herein is for the purpose of describing particular embodiments only and is not intended to be limiting of the embodiments of the invention. As used herein, the singular forms "a", "an" and "the" are intended to include both the singular and plural forms, and the terms "and" and "or" are each intended to include both alternative and conjunctive combinations, unless the context clearly indicates otherwise. It will be further understood that the terms "comprises" or "comprising," when used in this specification, specify the presence of stated features, integers, actions, steps, operations, elements, or components, but do not preclude the presence or addition of one or more other features, integers, actions, steps, operations, elements, components, or groups thereof. Furthermore, to the extent that the terms "includes", "having", "has", "with", "comprised of", or variants thereof are used in either the detailed description or the claims, such terms are intended to be inclusive in a manner similar to the term "comprising".

While all the invention has been illustrated by a description of various embodiments, and while these embodiments have been described in considerable detail, it is not the intention of the Applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the Applicant's general inventive concept.

What is claimed is:

1. A system for monitoring a tool health condition, comprising:
 one or more processors; and
 a memory coupled to the one or more processors and including program code that, when executed by the one or more processors, causes the system to:

collect first operational data from a machine while the machine is operating in a predetermined manner with a tool including a plurality of pockets, the tool being in a first known health condition defined by operatively coupling a first number of inserts into a like number of the plurality of pockets;

collect second operational data from the machine while the machine is operating in the predetermined manner with the tool in a second known health condition defined by operatively coupling a second number of inserts into a like number of the plurality of pockets, the second number being different from the first number;

extract a first plurality of features from the first operational data;

extract a second plurality of features from the second operational data;

generate a training dataset from the first plurality of features and the second plurality of features; and train an analytic model to determine the health condition of the tool using the training dataset.

2. The system of claim 1, wherein the program code causes the system to generate the training dataset from the first plurality of features and the second plurality of features by:

comparing each feature of the first plurality of features to a like feature of the second plurality of features; and selecting a subset of features from each of the first plurality of features and the second plurality of features as the training dataset based on the comparisons.

3. The system of claim 2, wherein the program code causes the system to compare each feature of the first plurality of features to the like feature of the second plurality of features by determining a magnitude of a difference between the features being compared.

4. The system of claim 3, wherein the program code causes the system to select the subset of features from each of the first plurality of features and the second plurality of features as the training dataset based on the comparisons by selecting one or more features based on the magnitudes of the differences.

5. The system of claim 1, wherein the first number is equal to a total number of pockets in the tool, and the second number is less than the first number.

6. The system of claim 1, wherein the program code causes the system to operate the machine in the predetermined manner by causing the machine to rotate the tool at a predetermined speed.

7. The system of claim 1, wherein the machine includes a motor operatively coupled to a spindle, and each of the first operational data and the second operational data includes data indicative of one or more of a vibration, a power consumption of the motor, a speed of the motor, an amount of torque generated by the motor, a position of the spindle, a movement of the spindle, and a force applied to the spindle.

8. The system of claim 1, wherein each plurality of features includes one or more of a frequency domain feature, a time domain feature, and a time-frequency domain feature.

9. A method of monitoring a tool health condition, comprising:

collecting first operational data from a machine while the machine is operating in a predetermined manner with a tool including a plurality of pockets, the tool being in a first known health condition defined by operatively coupling a first number of inserts into a like number of the plurality of pockets;

collecting second operational data from the machine while the machine is operating in the predetermined manner with the tool in a second known health condition defined by operatively coupling a second number of inserts into a like number of the plurality of pockets, the second number being different from the first number;

extracting a first plurality of features from the first operational data;

extracting a second plurality of features from the second operational data;

generating a training dataset from the first plurality of features and the second plurality of features; and training an analytic model to determine the health condition of the tool using the training dataset.

10. The method of claim 9, wherein generating the training dataset from the first plurality of features and the second plurality of features includes:

comparing each feature of the first plurality of features to a like feature of the second plurality of features; and selecting a subset of features from each of the first plurality of features and the second plurality of features as the training dataset based on the comparisons.

11. The method of claim 10, wherein comparing each feature of the first plurality of features to the like feature of the second plurality of features includes determining a magnitude of a difference between the features being compared.

12. The method of claim 11, wherein selecting the subset of features from each of the first plurality of features and the second plurality of features as the training dataset based on the comparisons includes selecting one or more features based on the magnitudes of the differences.

13. The method of claim 9, wherein the first number is equal to a total number of pockets in the tool, and the second number is less than the first number.

14. The method of claim 9, wherein operating the machine in the predetermined manner includes causing the machine to rotate the tool at a predetermined speed.

15. The method of claim 9, wherein the machine includes a motor operatively coupled to a spindle, and each of the first operational data and the second operational data includes data indicative of one or more of a vibration, a power consumption of the motor, a speed of the motor, an amount of torque generated by the motor, a position of the spindle, a movement of the spindle, and a force applied to the spindle.

16. The method of claim 9, wherein each plurality of features includes one or more of a frequency domain feature, a time domain feature, and a time-frequency domain feature.

17. A computer program product for monitoring a tool health condition, comprising:

a non-transitory computer-readable storage medium; and program code stored on the non-transitory computer-readable storage medium that, when executed by one or more processors, causes the one or more processors to:

collect first operational data from a machine while the machine is operating in a predetermined manner with a tool including a plurality of pockets, the tool being in a first known health condition defined by operatively coupling a first number of inserts into a like number of the plurality of pockets;

collect second operational data from the machine while the machine is operating in the predetermined manner with the tool in a second known health condition defined by operatively coupling a second number of inserts into a like number of the plurality of pockets, the second number being different from the first number;

extract a first plurality of features from the first operational data;

extract a second plurality of features from the second operational data;

generate a training dataset from the first plurality of features and the second plurality of features; and train an analytic model to determine the health condition of the tool using the training dataset.

* * * * *